United States Patent [19]

Freeman

[11] 4,038,525

[45] July 26, 1977

[54] TALLYING METHOD AND MEANS

[76] Inventor: Arthur G. Freeman, 6133 Faust, Lakewood, Calif. 90713

[21] Appl. No.: 572,281

[22] Filed: Apr. 28, 1975

[51] Int. Cl.² ........................ G07D 9/00; H03K 21/36

[52] U.S. Cl. ........................ 235/92 CN; 235/92 PL; 235/92 EA; 235/92 R

[58] Field of Search ........ 235/92 CN, 92 AC, 92 FL, 235/92 DM, 92 EA, 92 R, 92 PL

[56] References Cited

U.S. PATENT DOCUMENTS

| | | | |
|---|---|---|---|
| 2,472,542 | 6/1949 | Moerman | 235/92 CN |
| 3,323,527 | 6/1967 | Kepiwu | 235/92 CN |
| 3,754,122 | 8/1973 | Dinapoli et al. | 235/92 R |
| 3,779,357 | 12/1973 | Haller et al. | 235/92 FL |
| 3,835,305 | 9/1974 | Kus | 235/92 FL |

*Primary Examiner*—Joseph M. Thesz
*Attorney, Agent, or Firm*—Grover A. Frater

[57] ABSTRACT

A secure tally method and means is provided for tallying events such as dispensing of product and receipt of coins by a vending machine. These events are made to initiate a signal in a signal generator. The number of those signals is recorded in a counter which is physically removeable from the signal generator and which must be removed to determine what count is stored. The counter is one that has a maximum counting capacity either by its construction or pre-loading. To read it, one adds counts until the capacity of the counter is reached. Subtracting the added counts from the counter's maximum capacity determines the number of counts that were entered as a result of the occurrence of the events being counted. When the event is the receipt of coins, the system is extended to compute value received by generating and counting signals in an amount corresponding to the value of the coins.

2 Claims, 3 Drawing Figures

TALLYING METHOD AND MEANS

This invention relates to improvements in methods and apparatus for tallying. While not limited to tallying the value of coinage, it is particularly well suited to that application.

BACKGROUND

The invention solves two basic problems of the kind that are faced by owners of coin operated vending machines. One relates to accounting. The other relates to theft of money and the conversion or embezzlement of goods from the machines. Theft and embezzlement is a problem of major proportions. A majority of the thefts are committed by people who are hired to service the machines and to collect the monies deposited in them. A protective system must take into account a wide range of circumstances. In some cases, there is an attempt to adjust the inventory record of goods to prevent discovery of the theft. Sometimes no attempt is made to hide the fact of a theft, but the thievery is accomplished in a way that makes it difficult to discover at which machine and at what time the theft occurred. Prior schemes to discourage thievery have involved elaborate inventory systems, a division of the tasks of replacing the goods in machines and collecting monies from them, and a variety of other schemes.

Almost all vending machines include some mechanisms for testing for counterfeit coins. Many vending machines include mechanisms for counting coins and for computing the value of the coins that have been inserted. Thus, there is a mechanism within the vending machine for comparing the denomination of the coins inserted in the machines and for giving credit when the requisite coinage has been received. It is possible to begin with that counting and testing and crediting structure to devise an apparatus that will count the number of coins of each denomination that have been received and to compute the total of money that has been received. Such mechanisms have been made the basis for security systems. They have a number of short-comings. It is difficult to make the system tamper proof such that it is not possible to roll back the count or to count in the forward direction through maximum count and beyond to a lesser count than the true one. More serious is the problem that, unless the counting apparatus is dismantled and carried back to the owner or trusted lieutenant, there is no practical way, short of making the collections themselves, that the owner or his trusted agent can know what the count was. Again, while this description of problems to be solved by the invention is limited to the field of coin operated vending machines, the invention does not have that limitation. It has broader applications and can be used whenever a series of discreet events, or things, or occurences, must be tallied.

The other problem relates to inventory control and accounting. It has been difficult to secure adequate and timely data on vended sales and receipts. As a result, it has been very difficult to apply mechanized accounting and inventory control techniques to the vending machine business.

SUMMARY OF THE INVENTION

It is an object of the invention to provide a highly secure tallying method and to provide an apparatus for practicing that method. Another object is to provide a tallying means and method which are particularly well suited for use with coin operated and currency operated vending machines. For that application, and for many others, it is necessary to provide an apparatus which is virtually tamper proof, which is rugged enough to withstand field use, which can be produced at a reasonably low cost and which is applicable, with minor change, to a wide variety of vending machine coil collecting and crediting structures.

It is another object of the invention to provide an apparatus which can provide information about the amount of money collected and the amount of product and the kind of product dispensed by individual vending machines. It is an object to provide that information in a form that can be transferred directly to automatic data storage and processing machines.

It is another object of the invention to provide apparatus that will accomplish those objectives and which can be readily added to pre-existing vending machines. In that connection, it is an object to provide an apparatus which can be installed in the field, but which cannot be installed in a way that permits alteration of its data.

These several objects are realized in the invention by the provision of an apparatus which records current events, such as the acceptance of coins, as they occur. They are recorded in a tally having a known maximum recording capacity. If the invention is applied to counting the benefits or products that are dispensed by a vending machine, then the invention may include an apparatus which will record the dispensing of the benefit or product at the time that it is done. If the invention is applied to determining what monies have been deposited in a vending machine, then the apparatus includes a means for recording in the tally or adder a count corresponding to the number of times that the value of the coins exceeds some common denomination By way of example, if the vending machine accepts a dime, then twice as many counts are recorded in the tally or adder as are recorded when the machine accepts a nickle.

The tally or adder is one that was a known maximum recording capacity. In the preferred form of the invention, the adder or tally is structured so that it can be physically separated from the vending machine and taken elsewhere for an examination of its contents. Its contents are examined by an apparatus which enters additional counts or records until the capacity of the tally or counter has been reached. The number of counts that are added to fill the tally or adder is subtracted from the known maximum recording capacity. The difference between the maximum capacity and the number of additional counts is equal to the number of events that was recorded in the tally or adder during the period in which it was disposed in the vending machines, provided, of course, that the count had been returned to zero, or maximum, when the unit was first installed in the machine. In the preferred apparatus for practicing the invention, the counting is done electronically in a device which produces pulses or other signals which are indicative of the value of coins accepted by the vending machine, or the number of products dispensed by the machine. The apparatus includes a counter in which those pulses or signals are counted and in which the count is maintained only as an electrical state. The counter is made so that it can be removed from the vending machine and replaced with another. It is arranged in the preferred embodiment so that any attempt to read it results in an "erasure" of the count. To determine its contents, the counter is connected to a read-out device which applies additional signals or pulses to the counter until the counter is completely filled, or emptied, at which time a "spill-over" signal is provided by the counter. The number of added counts is itself counted and that count is algebraically subtracted, preferably electronically, from the known maximum capacity of the counter.

The invention can be more easily understood by examination of the preferred embodiment shown in the accompanying drawings. It is to be understood that the embodiment shown is but one example of how the invention can be practiced and that the invention is defined by the appended claims, rather than by the specific embodiments illustrated.

Figure 1:
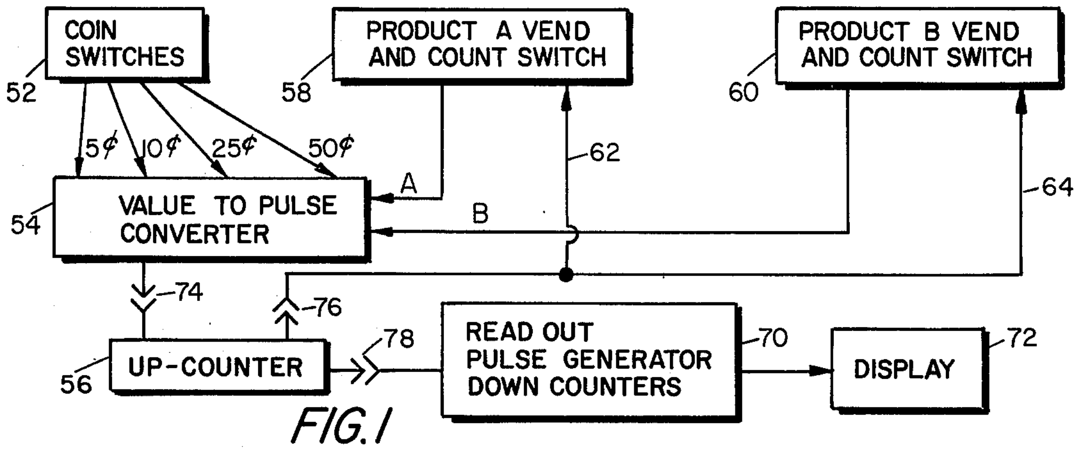
FIG. 1 is a block diagram of a system which embodies the invention showing how it is related to a vending machine.

The diagram of FIG. 1 assumes that the invention is associated with a vending machine which has a coin chute capable of accepting coins of five cent, ten cent, twenty-five cent, and fifty cent denominations. It also assumes that that vending machine provides electrical signals which indicate whether or not a coin of that denomination has been accepted by the vending machine.

FIG. 1 also asumes a vending machine that dispenses two products, identified as product A and product B. It assumes some means for accepting an electrical signal which must be received as a condition precedent to releasing the product, and it assumes that the vending machine provides an electrical signal which indicates that a product has been vended and which identifies whether it was product A or product B that was vended. Most vending machines are arranged so that they will not release a product unless an electrical signal is received by a release mechanism. Not all vending machines provide an electrical signal on the occasion of the product being vended. However, most vending machines are arranged so that a signal can be generated when a product is vended and it can be provided with relative ease. Thus, the invention is applicable to most existing vending machines and, of course, it is easily applied to machines not yet manufactured.

In FIG. 1, the coin chute and coin switches of the vending machine are represented by the box numbered 52. It is assumed that the vending machine will accept nickles, dimes, quarters, and fifty cent pieces. Switches activated by the acceptance of a coin provide a signal at line 5 or line 10 or line 25 or line 50, depending upon the denomination of the coin that was accepted. Those signals are applied to a VALUE TO PULSE CONVERTER unit 54. That unit converts the coin switch signals to pulses, the number of which is a measure of the value of the coin that was accepted by the machine. The pulses generated in the VALUE TO PULSE CONVERTER are applied to a counter 56 which in this embodiment is an UP-COUNTER.

The VALUE TO PULSE CONVERTER and the UP-COUNTER unit 56 may include several converters and several counters. In this case, they do. The VALUE TO PULSE CONVERTER 54 is capable of accepting signals from input lines A and B and converting them to pulses which are counted in the UP-COUNTER 56. The vending machine includes a means for releasing product A and for indicating when that product has been vended.

The apparatus that provides those functions in the vending machine is represented by the block 58. A similar block 60 represents the part of the vending machine that accepts release signals and releases product B and provides signals indicating that product B has been vended. Those latter signals are applied on an output line B which is applied to the VALUE TO PULSE CONVERTER. The UP-COUNTER or counters 56 are arranged so that they provide signals by lines 62 and 64 to the product release mechanisms that are a part of mechanisms 58 and 60, respectively.

The system of FIG. 1 also includes a READ-OUT PULSE GENERATOR AND DOWN-COUNTERS. That apparatus is represented by block 70 whose output is applied to a display unit 72 and may also be applied to an accounting and inventory control computer.

Connectors 74, 76 and 78 have been shown in FIG. 1 as separable units to indicate that the UP-COUNTER unit 56 may be detached from the vending machine and from the VALUE TO PULSE CONVERTER and connected, instead, to the READ-OUT PULSE GENERATOR AND DOWN-COUNTERS. The VALUE TO PULSE CONVERTER 54 is made part of the vending machine. The UP-COUNTER 56 is electrically connected to the VALUE TO PULSE CONVERTER by being plugged into it for a period of time over which coins are inserted into the coin chute and products are dispensed by the vending machine. At the time that the service person or coin collector removes the coins from the receptacle of the vending machine, he also removes the UP-COUNTER. The coin collector removes the coins from the coin collection container, or simply removes the entire container and replaces it with another. He removes the UP-COUNTER 56 and replaces it with another. The UP-COUNTER he removed is carried away to a collection and accounting station at which the contents of the counter are read. They are read by a device called a read-out unit or READ-OUT PULSE GENERATOR AND DOWN-COUNTERS 70 which adds additional pulses to the input of the UP-COUNTER until that counter is filled. The UP-COUNTER provides a spill-over signal which terminates generation of pulses in the read-out device 70. That generator furnishes pulses not only to the UP-COUNTER, but it furnishes them to a down-counter in the read-out device 70, and the count in that down-counter is displayed in unit 72.

Figure 2:
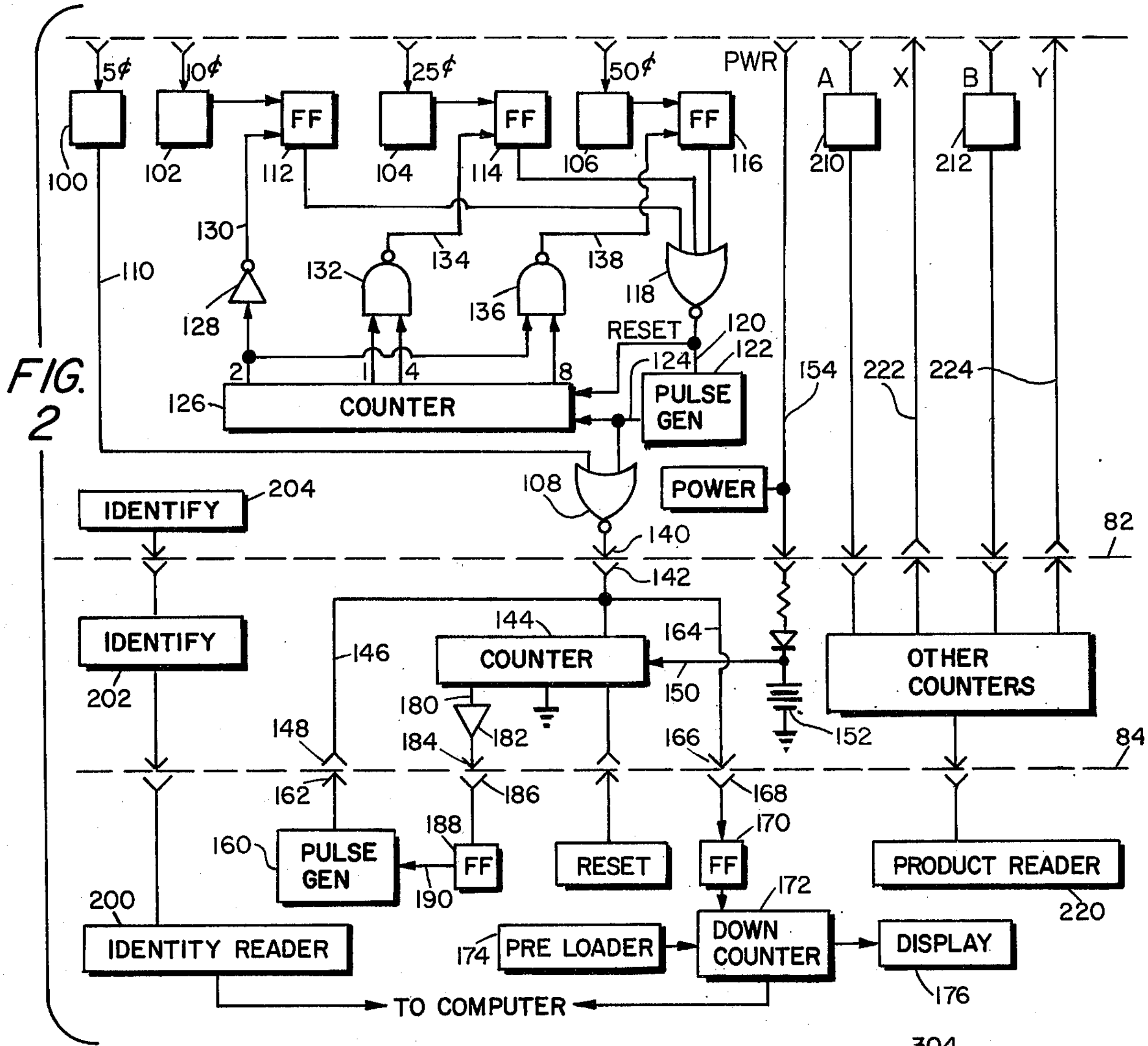
FIG. 2 is a partially diagramatic and partially schematic drawing of a system embodying the invention.

FIG. 1 indicates that the plug-in unit 56 includes an up-counter and that the read-out unit 70 includes a down-counter. The embodiment shown in FIG. 2 is similarly arranged. However, while that is the preferred arrangement, the invention can be practiced by using a down-counter in the unit 56, and up-counters in the read-out unit 70.

FIG. 2 is divided by dashed lines 80, 82 and 84, into these sections. The uppermost section lies between lines 80 and 82 and it is the VALUE TO PULSE CONVERTER 54 of FIG. 1. It has four inputs at the upper left marked five cents, ten cents, twenty-five cents, and fifty cents, respectively. Whether they be thought of as current signals or voltage signals, or simply a change in impedance, the appearance of a signal at one of those inputs indicates that a coin has been accepted by the vending machine and that the denomination of the coin corresponds to the terminal at which the signal appears.

Figure 3:
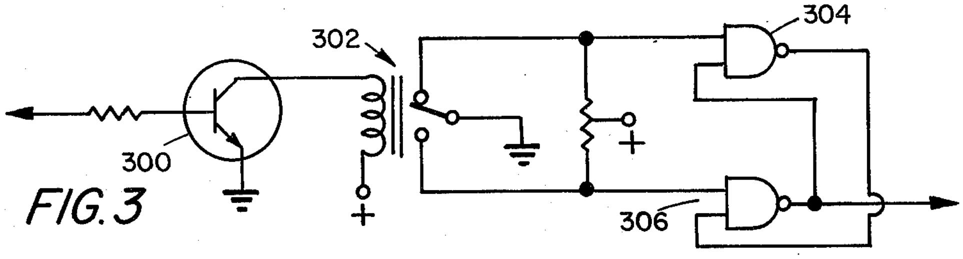
FIG. 3 is a schematic drawing of one form of the isolation circuit that is employed in FIG. 2.

Signals applied to the five cent input terminal are applied to isolation device 100. Signals applied to the ten cent, the twenty-five cent, and the fifty cent lines are applied to isolation circuits 102, 104 and 106, respectively. The purpose of those isolation units is to separate the electrical circuitry in the VALUE TO PULSE CONVERTER and the UP-COUNTER from the electrical circuitry in the vending machine itself. That is required primarily because there are not standards for generation of coin acceptance signals. The preferred isolation circuit is one that employs a relay so that there is only a magnetic connection between the switch signal circuits and the circuits of the VALUE TO PULSE CONVERTER unit. A representative isolation unit is depicted in FIG. 3 and will be described subsequently.

The output of isolation unit 100 is applied to one input of NOR gate 108. The output of isolation unit 102 is applied to one input of a flip-flop 112. The output of isolation unit 104 is applied to one input of a flip-flop 114 and the output of isolation unit 106 is applied to one input of a flip-flop 116. The output of all three of those flip-flops is applied to a NOR gate 118.

If any one of the flip-flops 112, 114 or 116 applies an input signal to NOR gate 118, then an enable signal will appear on line 120. It is applied to a pulse generator 122 which thereupon begins generating pulses which are applied by a line 124 to the other input of NOR gate 108 and to the input of a counter 126. The counter has four outputs corresponding to one, two, four and eight counts, respectively. Those outputs are applied to the second input terminals of flip-flops 112, 114 and 116. The output corresponding to two counts is applied through an inverting amplifier 128 to a line 130 and the second input of flip-flop 112. The outputs corresponding to one and four pulses are applied to a NOR gate 132 whose output is connected by line 134 to the second input of flip-flop 114. Finally, the output corresponding to two pulses and the output corresponding to eight pulses are applied to the two input lines of a NOR gate 136 whose output is applied by a line 138 to the second input of a flip-flop 116.

When a dime is inserted into the vending machine, a signal appears at the ten cent terminal which causes the isolation device 102 to provide a turn-off signal to flip-flop 112. The output of that flip-flop is applied to NOR gate 118 which furnishes an enable signal on line 120 to turn on the pulse generator 122. That generator furnishes two pulses by line 124 to counter 126. When those two pulses have been furnished, a signal appears at output two and ultimately at the other input of flip-flop 112 which turns that flip-flop off. As a consequence, the NOR gate 118 is turned off to terminate the enable signal on line 120. That same line is connected to a reset terminal in the counter. Termination of the enable signal constitutes a reset signal in response to which the counter is reset.

The two pulses that were generated in pulse generator 122, are applied by line 124 to the inverting NOR gate 108 whereby two pulses appear at terminal 140. Similarly, if a signal appears in the twenty-five cent line, the NOR gate 118 will turn on the pulse generator 122 which will generate five pulses and apply them to the NOR gate 108 before the counter and the NOR gate 132 generate a turn-off signal in flip-flop 114. If a signal appears on the fifty cent line, the pulse generator will deliver ten pulses to the terminal 140 before the counter and NOR gate 136 apply a turn-off signal to the flip-flop 116.

Summarizing, a signal on the five cent line will open gate 108 and one pulse will appear at terminal 140. Two pulses will appear at that terminal if a ten cent signal is received, five pulses will appear if a twenty-five cent signal is received, and ten pulses will appear at terminal 140 if a fifty cent signal is received.

The unit marked UP-COUNTER 56 in FIG. 1 contains the elements which appear between dotted lines 82 and 84 in FIG. 2, and that unit is plugged into the VALUE TO PULSE CONVERTER 54. That means, in particular, that terminal 140 is connected to terminal 142 whereby signals at the output of NOR gate 108 are applied to the counter 144. That counter counts all of the pulses that appear at terminal 142 and, because that terminal is connected by line 146 to an input terminal 148, it will count all of the pulses that appear at terminal 148. Terminal 148 is not accessible and it is not used when the unit is plugged into the VALUE TO PULSE CONVERTER. Accordingly, counter 144 simply counts all of the pulses that are applied at terminal 142. Power for the counter is delivered by a line 150 from a battery 152 which is charged up through a half-wave rectifier circuit from power applied by a line 154 which extends through the VALUE TO PULSE CONVERTER. The counter unit does nothing more than count pulses. When it is removed from the value to pulse converter and is taken away to be "read", it is plugged into the READ-OUT PULSE GENERATOR AND DOWN-COUNTER unit which appears below and dashed line 84 in FIG. 2. That unit includes a pulse generator 160 having an output terminal 162 which plugs into terminal 148. That terminal is connected by line 146 to the input of counter 144. When the read-out unit is turned on, a pulse generator begins furnishing pulses to the counter. Simultaneously, it applies pulses by line 164 to an output terminal 166 which is connected to an input terminal 168 of read-out unit. Signals appearing at that terminal are applied to a flip-flop 170 and the output of the flip-flop is applied to a down-counter 172. The down-counter is preloaded by a preload unit 174 so that it includes, as a maximum count, a count corresponding to the maximum capacity of counter 144. That count is converted to dollars and is displayed on display unit 176. When the pulse generator 160 begins furnishing pulses to counter 144, it also furnishes counts to the down-counter 172. Each pulse at pulse generator 160 adds another count to the counter 144 and subtracts one count from down-counter 172 and subtracts five cents from the display unit 176. In practice, the combination of the flip-flop 170 and the down-counter 172 is such that the flip-flop performs a divide-by-two function so that the display is accurate only to ten cents, but that is a matter of circuit detail. The pulse generator 160 continues until the counter is entirely filled at which time a spill-over signal is applied by output line 180 to amplifier 182 and output terminal 184. That terminal is connected to input terminal 186 in the read-out device. Terminal 186 connects to a flip-flip 188 which is activated to turn off the pulse generator 160 by a signal applied by line 190. When the pulse generator 160 is turned off, no further signal appears at terminals 166 and 168. The down-counter 172 stops counting down, and the display 176 indicates the amount of money that should be found in the coin box of the vending machine. A second output from the down-counter 172 may be connected by line 194 to a computer. Information about the identity of the machine in which the counter was installed is supplied by an identity reader 200 which reads an identity reader 202 in the counter unit which, in turn, reads the content of a read-only-memory 204 that is built into the VALUE TO PULSE CONVERTER.

It will be apparent that the system would work if the counter 114 were made a down-counter and the down-counter 172 in the read-out unit was made an up-counter. Moreover, the counters can be preloaded to any maximum or minimum count, and they can be arranged to provide the spill-over signal at any count.

To the extent that it has been described, FIG. 2 relates to tallying the value of coins. Similar counter units and read-out units can be incorporated for measuring the amount of each kind of product that is dispensed by the vending machine. If each unit of product A is like every other unit of product A, and if each unit of product B is like every other unit of product B, then the value to pulse converter can be much less complicated than it is when used for measuring the value of coins. That is because all units of product A and all units of product B will have the same value. In that case, no more is required than is required for the five cent line. That is, a signal indicating that product A has been dispensed is applied at terminal A to an isolation unit 210 and the output of that isolation unit is connected directly to a counter unit. Similarly, if a product B is dispensed, a signal appears at terminal B at the input of value to pulse converter unit. That signal is applied by the isolation unit 210 to another counter in the counter unit and the contents of those counters are read in product reader 220 when the plug-in counter unit is removed from the vending machine and is plugged into the read-out device. Lines 222 and 224 in the VALUE TO PULSE CONVERTER between dashed lines 80 and 82 simply apply signals to the terminals X and Y to be used in enabling the mechanism that releases products so that it may be vended.

The system shown will identify the vending machine. It will tally the value of the coins that are accepted by the machine. It will also tally the amount of product or benefit vended. These tallies are recorded in a way that is not readable in the vending machine. They must be carried to a read-out device away from the vending machine. Reading erases the count and there is no way to subtract from the count. No product can be dispensed unless the tally is installed and, if installed, no coin can be received without being counted. The result is a very secure system which includes all the data required for accounting and inventory control on a machine-by-machine basis.

The isolation circuit of FIG. 3 is representative of a number of suitable arrangements. A coin switch signal applied to the base of transistor 300 turns the transistor on. Current flows in the coil of relay 302 and operates the relay to connect the input of gate 304 or gate 306 to ground. The gates from a flip-flop, the output of which is a pulse.

Although I have shown and described certain spedific embodiments of my invention, I am fully aware that many modifications thereof are possible. My invention, therefore, is not to be restricted except insofar as is necessitated by the prior art.

I claim:

1. In an apparatus for tallying:

first signal generating means responsive to an event for generating signals upon the occurrence of said event;

second signal generating means for generating such signals independently of the occurrence of said event;

counting means in the form of a counter having a maximum capacity for counting signals from said first and second signal generating means until its capacity is reached;

read-out means for counting the number of signals furnished to said counting means by said second signal generating means and for finding the difference between the maximum capacity of said counting means and the number of signals from first signal generating means which are counted by said counting means; and means for preloading, to the maximum capacity of said counting means, one of said counting means or said read-out means.

2. The invention defined in claim 1 in which said counting means comprises an up-counter and said read-out means comprises a down-counter;

said means for preloading comprising means for preloading said down-counter.

* * * * *